(12) United States Patent
Kaim et al.

(10) Patent No.: US 9,269,528 B2
(45) Date of Patent: Feb. 23, 2016

(54) MEDIUM CURRENT RIBBON BEAM FOR ION IMPLANTATION

(71) Applicant: ADVANCED ION BEAM TECHNOLOGY, INC., Hsinchu (TW)

(72) Inventors: Robert Kaim, Brookline, MA (US); Charles M. Free, Rowley, MA (US); David Hoglund, Arlington, MA (US); Wilhelm P. Platow, Salem, MA (US); Kourosh Saadatmand, Merrimac, MA (US)

(73) Assignee: ADAVANCED ION BEAM TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 14/490,253

(22) Filed: Sep. 18, 2014

(65) Prior Publication Data

US 2015/0102233 A1 Apr. 16, 2015

Related U.S. Application Data

(60) Provisional application No. 61/891,228, filed on Oct. 15, 2013.

(51) Int. Cl.
*G21K 5/04* (2006.01)
*H01J 37/08* (2006.01)
*H01J 37/317* (2006.01)

(52) U.S. Cl.
CPC .............. *H01J 37/08* (2013.01); *H01J 37/3171* (2013.01); *H01J 2237/006* (2013.01); *H01J 2237/0473* (2013.01); *H01J 2237/30472* (2013.01)

(58) Field of Classification Search
USPC ................ 250/492.1, 492.2, 492.21, 492.22, 250/492.23, 492.3, 396 R, 397
See application file for complete search history.

(56) References Cited

U.S. PATENT DOCUMENTS

| | | |
|---|---|---|
| 5,350,926 A | 9/1994 | White et al. |
| 5,834,786 A | 11/1998 | White et al. |
| 7,078,713 B2 | 7/2006 | White |
| 7,326,941 B2 | 2/2008 | Chen et al. |
| 7,462,843 B2 | 12/2008 | Chen et al. |
| 2010/0055345 A1* | 3/2010 | Biloiu ............... H02J 27/18 427/569 |

* cited by examiner

*Primary Examiner* — Nicole Ippolito
(74) *Attorney, Agent, or Firm* — Muncy, Geissler, Olds & Lowe, P.C.

(57) ABSTRACT

A method of setting up a medium current ribbon beam for ion implantation is provided. It includes providing an ion source fed with a process gas and a support gas. The process ion beam is separated from the support gas beam with a mass analyzing magnet, and the intensity of the process ion beam is controlled by varying the ratio of process gas to support gas in the ion source gas feed. Process beam intensity may also be controlled with one or more mechanical current limiting devices located downstream of the ion source. An ion beam system is also provided. This method may control the total ribbon beam intensity at the target between approximately 3 uA to about 3 mA.

14 Claims, 5 Drawing Sheets

MEDIUM CURRENT RIBBON BEAM FOR ION IMPLANTATION

BACKGROUND OF THE INVENTION

1. Field of the Invention

The present invention relates to ion implantation, and, more especially, to a method of setting up a medium current ribbon beam for ion implantation and an ion beam system.

2. Description of the Prior Art

Ion implantation is a process used to introduce into a target substrate atoms or molecules, generally referred to as dopants, to make materials with useful properties. In the field of processing materials with ion beams, various techniques have been developed for producing large, approximately-parallel ribbon ion beams with controlled current uniformity.

Use of a ribbon beam for high current implantation is well known (U.S. Pat. No. 7,326,941, U.S. Pat. No. 7,462,843, U.S. Pat. No. 5,350,926 and U.S. Pat. No. 5,834,786). Uniform application of ions extracted from an ion source to a target is achieved by making the ion intensity distribution highly uniform at the target in the long dimension, and by translating the target in a direction substantially parallel to the short dimension.

In practice, a common target of ion beams is a silicon wafer. For high current implantation of 300 mm wafers, the total current of ions extracted from the ion source is in the range from about 10 mA to about 100 mA. The total intensity of ions in the part of the ribbon beam which strikes the wafer varies from about 3 mA to about 30 mA. The desired ion dose delivered to the wafer is generally in the range from 1E14 to 5E15 ions/cm$^2$. The energy of ions implanted into the wafer is in the range from 0.2 keV to about 20 keV, with ions being extracted from the ion source at 8 keV to 20 keV and subsequently decelerated as required.

SUMMARY OF THE INVENTION

The present invention enables the available range of a ribbon beam implanter to be extended to implant doses and beam currents which are lower by up to a factor of 1,000. Specifically, the methods and techniques of the present invention enable ribbon beams in which total intensity of ions in the part of the ribbon beam which strikes the wafer varies from about 3 uA to about 3 mA, and the ion dose delivered to the wafer is in the range from about 1E11 to 1E14 ions/cm$^2$. The methods and techniques may be used in an implanter which is designed specifically for medium current operation, or alternatively they may be used in an implanter which is capable of both medium and high current operation (doses from 1E11 to 5E15 ions/cm$^2$, and ribbon beam intensity from 3 uA to 30 mA).

The present invention is applicable to an extended range of ion energy, including both the energy of implantation (0.2 keV to >100 keV) and the energy of extraction from the source (8 keV to >40 keV).

A method is disclosed for medium current ion implantation with a ribbon ion beam having a short dimension and a long dimension. Uniform application of ions extracted from an ion source to a target is achieved by making the ion intensity distribution highly uniform at the target in the long dimension, and by translating the target in a direction substantially parallel to the short dimension.

In order to control the total ribbon beam intensity at the target between approximately 3 uA and 3,000 uA, the ion source gas feed is a mixture of a process gas and a support gas. The total output of the ion source is set to achieve a matched condition of the ion beam in the extraction gap. The process ion beam is separated from the support gas beam with a mass analyzing magnet, and the intensity of the process ion beam is controlled by varying the ratio of process gas to support gas in the ion source gas feed. Process beam intensity may also be controlled with one or more mechanical current limiting devices located downstream of the ion source.

In order to control the uniformity of the ribbon beam in its long dimension, one or more uniformity control devices are located in the beam line between the mass analyzing magnet and the target. Components which accelerate or decelerate the ion beam may also optionally be located between the mass analyzing magnet and the target.

BRIEF DESCRIPTION OF THE DRAWINGS

The foregoing aspects and many of the accompanying advantages of the present invention will become more readily appreciated as the same become better understood by reference to the following detailed description, when taken in conjunction with the accompanying drawings, wherein.

DESCRIPTION OF THE PREFERRED EMBODIMENT

The detailed description provided below and the preferred embodiments described are only for the purpose of description rather than for limiting the present invention.

Figure 1:
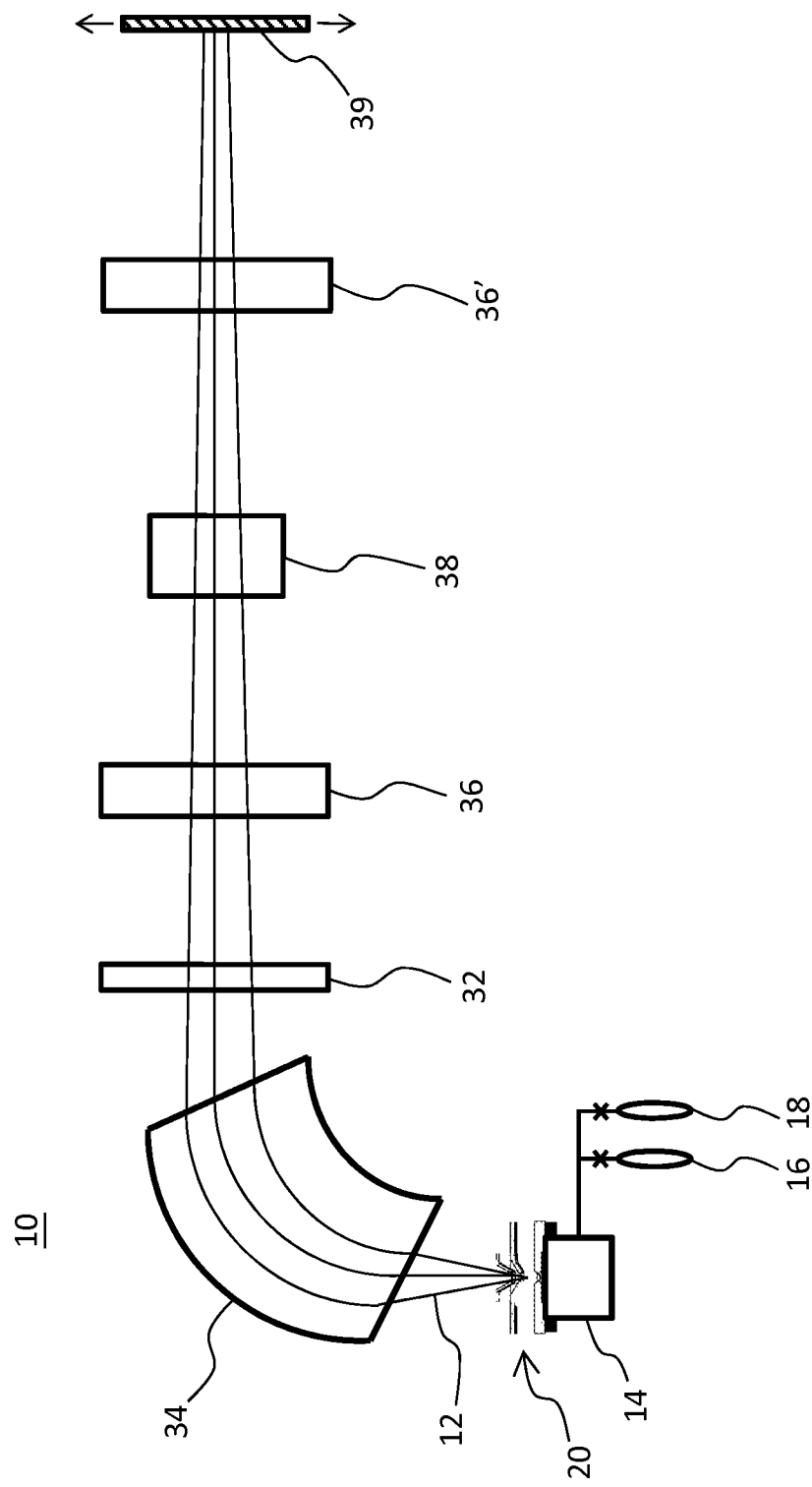
FIG. 1 is a schematic of an ion beam system illustrating the features of the present invention.

FIG. 1 is a schematic of an ion beam system illustrating the features of the present invention. The figure is a cross-sectional view in the plane of the short dimension of the ribbon ion beam at the target, such as the wafer 39. The long dimension of the ribbon is perpendicular to the plane of the figure and the wafer 39 is translated as shown by arrows in order to apply a uniform dose of ions over the surface of the wafer 39.

Figure 2A:
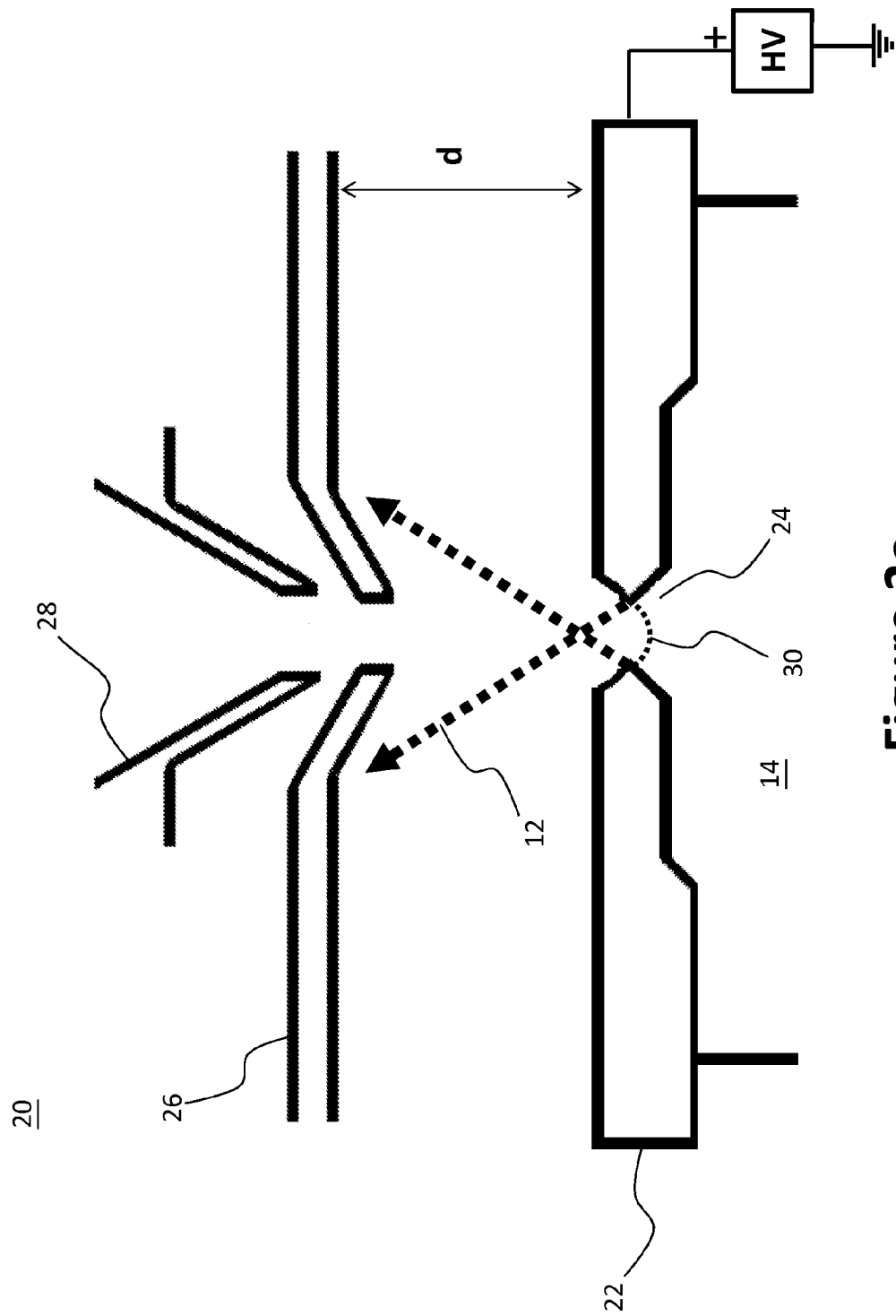
FIGS. 2a, 2b and 2c are close-up views of the ion source extraction system, in a cross-sectional view in the plane of the short dimension of the ion beam.
Figure 2B:
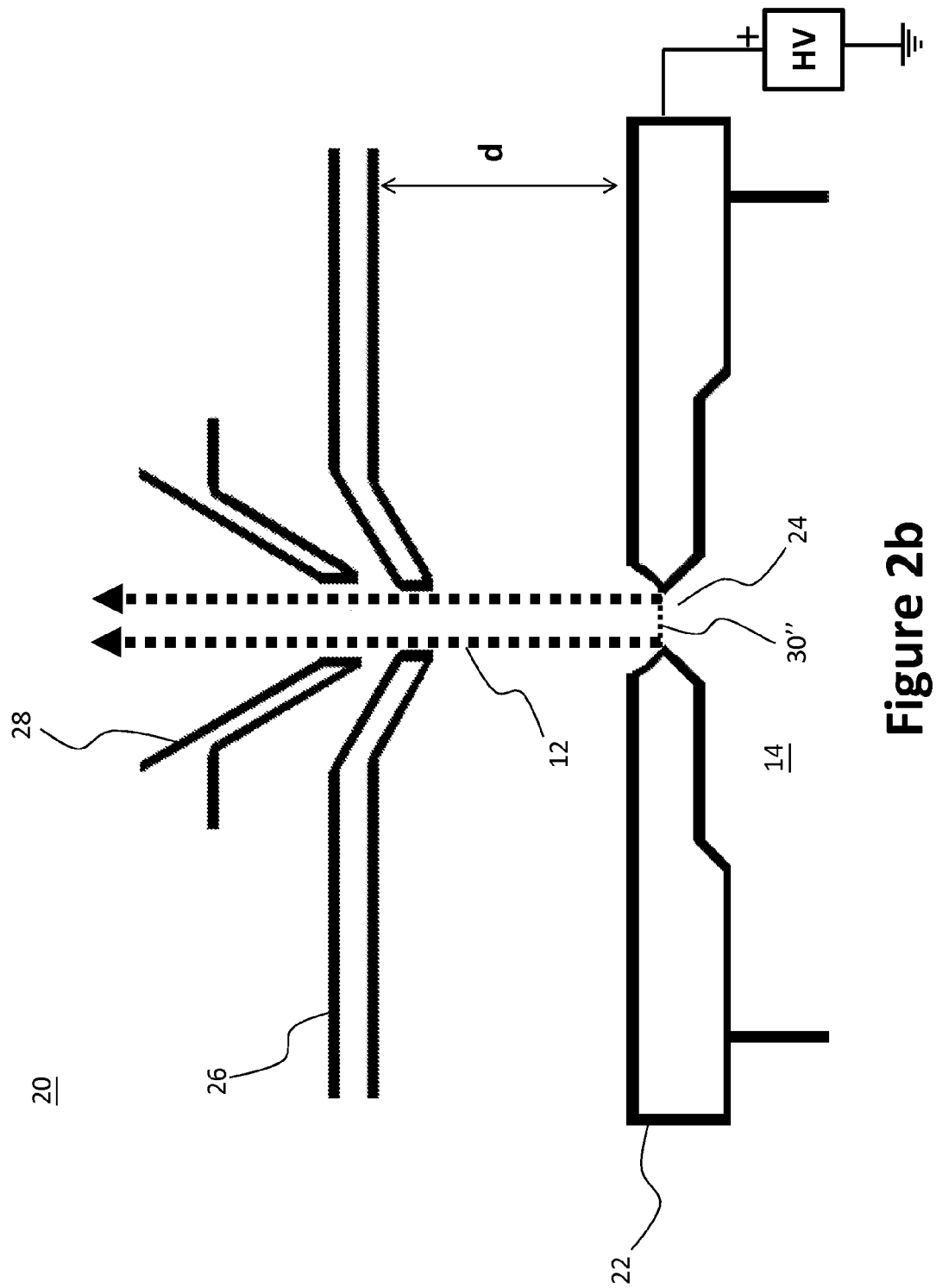
Figure 2C:
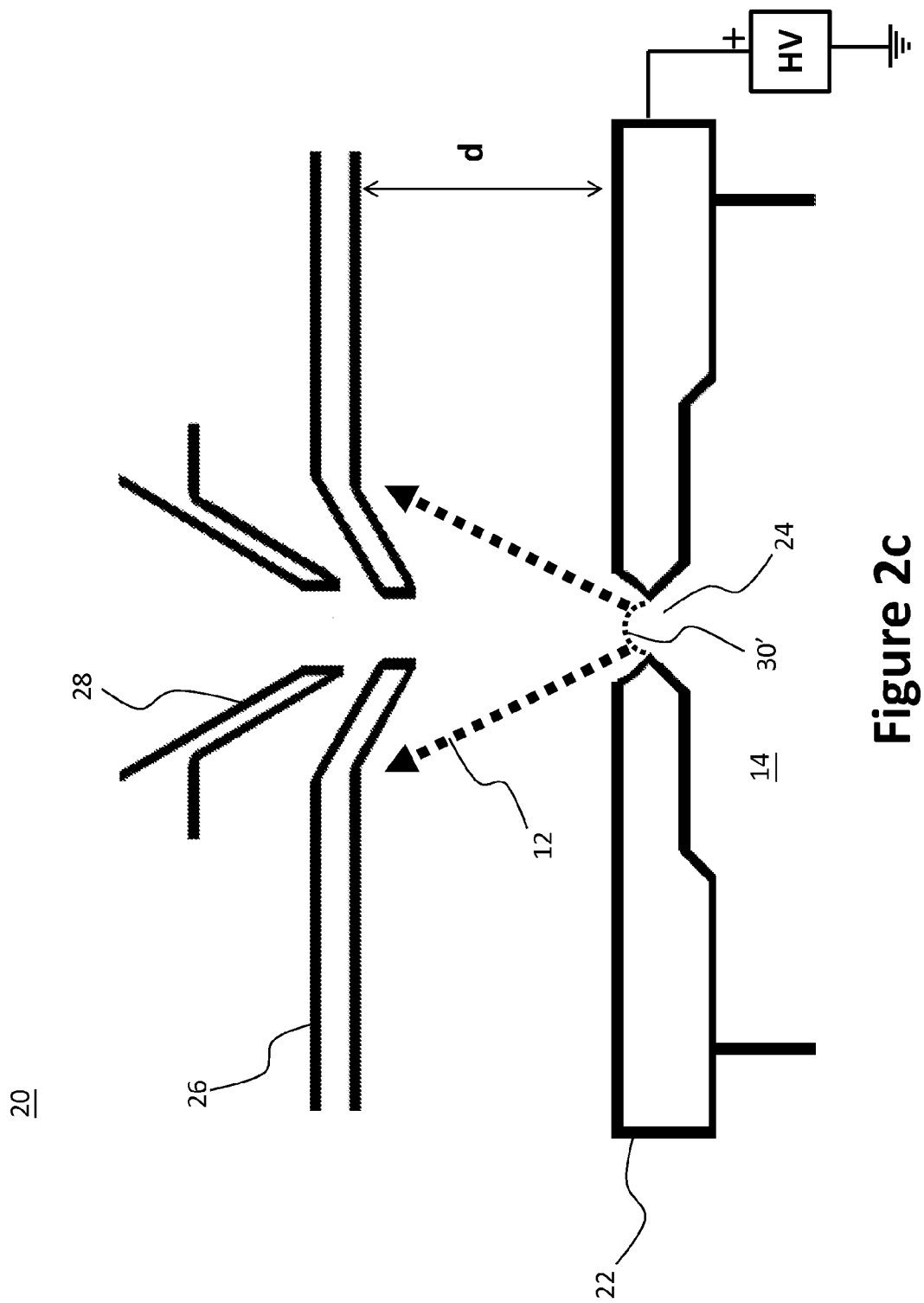

In the ion beam system 10, the ion beam 12 is extracted from an ion source 14 which is fed by at least two gases—a process gas 16 and a support gas 18. FIGS. 2a, 2b and 2c are close-up views of the ion source extraction system, in a cross-sectional view in the plane of the short dimension of the ion beam. In an ion source extraction system 20, the ion source 14 is at positive high voltage (ranging from about +0.2 kV to +100 kV) and has a source front plate 22 with a slit 24 or hole for extracting an ion beam 12. The source front plate 22 is separated from a suppression electrode 26 by a distance d, called the extraction gap, which is generally adjustable in the range from about 1 mm to 50 mm. The suppression electrode 26 has a negative voltage (−1 kV to −10 kV) relative to an attached ground electrode 28. The extraction scheme shown in FIGS. 2a, 2b and 2c is one example of ion beam extraction. Other known extraction schemes, such as tetrode extraction, are also possible.

A primary purpose of the present invention is to attain very low beam currents at the wafer, which means that very low beam currents extracted from the ion source is wished. However, with an ion source and extraction system configured for operation at high beam current, there is a current below which the extracted beam cannot be reduced without adversely affecting the beam quality. The reason is that to maintain acceptable beam quality, the source plasma density and extracted ion current have to be matched with the extraction voltage and gap.

FIG. 2a shows the case where the plasma density is too low, the plasma boundary 30 is concave, and the ions in the extraction gap are over-focused. FIG. 2c shows the case where the plasma density is too high, the plasma boundary 30' is convex, and the ions in the extraction gap are under-focused. FIG. 2b is the matched case, where the plasma boundary 30" is planar, the ion beam 12 is extracted with minimum divergence and there is minimum beam strike on the suppression electrode 26.

It has also been observed that when beam extracted from a slot is not matched to the extraction voltage and gap, the uniformity of the extracted beam along the length of the slot is poor, with intensity being strongly peaked at the top and bottom of the slot. This makes it more difficult to attain good uniformity of the ribbon beam at the wafer.

Therefore, it is necessary to operate the ion source plasma and extraction gap in a matched condition. Failure to have matching causes beam operational problems, including: large beam divergence, poor uniformity of beam extracted from a slot, and excessive suppression current, which may lead to high voltage instabilities and X-ray generation.

For a given extraction voltage, the lowest matched extracted current is obtained for smallest extraction field, or largest value of the gap d. Therefore the optimum operating condition for low beam current is at the matched extraction condition with a large gap, near the maximum mechanical limit of the mechanism which sets the gap. However, even for maximum gap, at extraction voltages greater than about 20 kV the matched extraction current can be many mA or even some tens of mA. For achieving beam current as low as 3 uA at the wafer, a reduction of the current by a factor of 1,000 to 5,000 from the extracted beam to the wafer is needed. According to the present invention, the reduction is achieved with two methods.

The first beam reduction method in accordance with one embodiment of the present invention includes providing an ion source fed with a process gas and a support gas. The process gas, which is a gas or vapor containing the material to be implanted into the wafer, and the support gas which is any other gas or gas mixture capable of supporting plasma in the ion source. The process gas is preferably phosphine, arsine or boron trifluoride, used for implanting P, As or B into the wafer, but any other suitable gas or vapor for any material to be implanted may be used.

The support gas is preferably an inert gas such as argon or xenon, but any other gas or vapor capable of supporting the ion source plasma may be used. The support gas is preferably a material with a relatively high atomic mass. This is because the source output at the matched extraction condition depends on the mass of ions in the plasma, and the higher the mass the lower the extraction current required for matching, which is advantageous for obtaining very low process beam current. For example, for the same extraction voltage and gap, the matched source extraction current for Xe support gas (mass 131) will be lower than for Ar support gas (mass 40).

When a mixture of two gases is fed into the ion source, the extracted beam will comprise ions made from both gases, with the ratio of ions from each gas being related to the ratio of the flow rates of the two gases into the source. The ions to be implanted into the wafer are derived from the process gas, and these ions are separated from ions derived from the support gas by means of a mass analyzing magnet. So for reducing the current of process ions, reduction of the flow rate of process gas relative to the support gas is needed. For example, if the process gas flow is 0.5 sccm and the support gas flow is 4 sccm, the density of process gas atoms in the source plasma will be 8 times less than the density of support gas atoms. If the ionization probability of the ions is about the same, then the extracted current of process gas ions will be about 8 times less than the extracted current of support gas ions. An ion source plasma consisting primarily of support gas ions is used to satisfy the extraction gap matching condition, and then the support gas ions are separated by the mass analyzer, leaving the much smaller current of process ions to be transported to the wafer.

The usable ratio of process gas to support gas is limited only by the range and accuracy of the mass flow controllers used to control the flow of the gases. Using a support gas flow of 4 sccm and a process gas flow of 0.1 sccm to 0.04 sccm, beam current reduction up to a factor of 40-100 is possible with this method.

The second beam reduction method in accordance with another embodiment of the present invention includes operating one or more current limiting devices, whose purpose is to reduce the beam current in the ion beam, located downstream of the ion source. As shown in FIG. 1, a current limiting device 32 is preferably placed at a location where the ion beam 12 is relatively wide, such as the exit of the mass analyzer 34 which may be a mass analyzing magnet, for example. The current limiting device 32 operates by mechanically limiting passage of the ion beam 12 by means of a variable slit or aperture. For example, if the width of the ion beam 12 at the device location is 50 mm, a slit of width 5 mm will reduce the ion beam 12 current by a factor of approximately 10x. The variable slit may be constructed of two plates whose edges move together, by a slot in a rotatable cylinder, or by any other suitable mechanical means.

The usable ratio of the beam current before and after the current limiting device is limited by the minimum width of the device relative to the width of the beam at that location. For a device width of 0.5 mm to 1.0 mm and beam width of 50 mm, beam current reduction up to a factor of 50-100 is possible with this method.

Thus it can be seen that, by combining the above two beam reduction methods, beam current reduction by a factor of 2,000 to 10,000 from extracted beam to ribbon beam on the wafer is possible. Total beam current on the wafer as low as 3 uA can therefore be achieved with extracted source beam currents as high as 6 mA to 30 mA.

Referring to FIG. 1 again, in the ion beam system 10, after extraction from the ion source, the ion beam traverses the mass analyzer 34, at least one current limiting device 32, one or two uniformity control devices 36, 36' and an acceleration/deceleration stage 38.

The mass analyzer 34 is used to select one ion mass and block other masses from the ion beam. Mass analyzers 34 are well known in the art. FIG. 1 shows a 90 degree mass analyzing magnet, but any other mass analyzer can be used. The current limiting device 32 is located downstream of the ion source and after the mass analyzer 34 to reduce the beam current in the process ion beam.

The purpose of the two uniformity control device 36, 36' is to create a highly uniform intensity distribution of ions along the long dimension of the ribbon beam at the wafer. Such uniformity control devices 36, 36' are known in the art for creating uniform ribbon ion beams for high current implantation. U.S. Pat. No. 7,078,713 and U.S. Pat. No. 7,326,941 describe a magnetic multipole device comprising multiple pairs of magnetic coils, wherein each pair of coils creates a quadrupole magnetic field for focusing or defocusing the ion beam. By varying the current in the coil pairs, the ion intensity distribution in the ribbon beam at the wafer may be adjusted to achieve the desired uniformity. Since it employs quadrupole fields, use of this device does not deflect the centroid of the ion beam, so that, as shown in FIG. 1, the ion beam passes through the device without deflection. On the other hand, the uniformity control devices described in U.S. Pat. No. 5,350,926 and U.S. Pat. No. 5,834,786 use dipole magnetic fields to adjust the ribbon beam. Use of these devices would cause deflection of the centroid of the ion beam, and are within the scope of the invention.

FIG. 1 shows two uniformity control devices 36, 36', but use of more or less than two is possible. The two uniformity control devices are shown one before and one after the acceleration/deceleration stage, but uniformity control devices may be arranged in any order.

The acceleration or deceleration stage 38 is optional. The energy of ion beam 12 extracted from the ion source 14 may be increased with an optional acceleration voltage, or decreased with an optional deceleration voltage. The acceleration or deceleration may be associated with a magnetic or electrostatic energy filtering device. The acceleration or deceleration may be without deflection of the centroid of the beam as shown in the figure, or may include beam centroid deflection.

Figure 3:
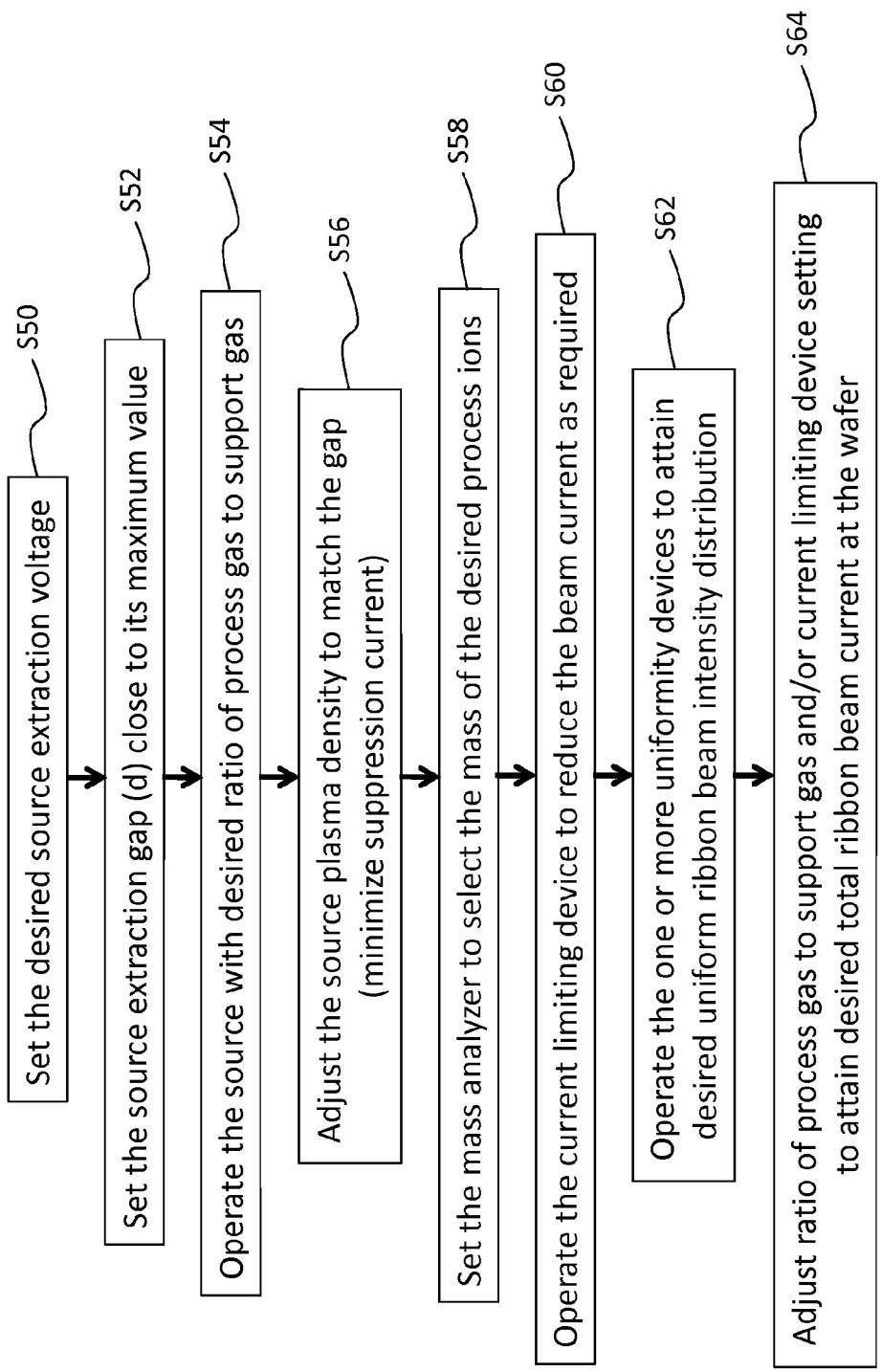
FIG. 3 illustrates a method of setting up a uniform medium current ribbon beam in accordance with an embodiment of the present invention.

To summarize, FIG. 3 illustrates a method of setting up a uniform medium current ribbon beam in accordance with an embodiment of the present invention:

In the step of S50, a desired source extraction voltage is set.

In the step of S52, a source extraction gap is set close to its maximum value.

In the step of S54, the desired ratio of process gas to support gas in the ion source gas feed is set.

In the step of S56, the source plasma density is adjusted to match the source extraction voltage and the source extraction gap. Here, the suppression current is minimized.

In the step of S58, the mass analyzer is set to select the mass of the desired process ions to be implanted into the wafer.

In the step of S60, a current limiting device is operated to reduce the beam current as required.

In the step of S62, one or more uniformity control devices are operated to attain a desired uniform ribbon beam intensity distribution at the wafer.

In the step of S64, the ratio of support gas to process gas is adjusted and/or the current limiting device is adjusted to attain the desired total ribbon beam current at the wafer.

To sum up, the present invention enables the available range of a ribbon beam implanter to be extended to implant doses and beam currents which are lower by up to a factor of 1,000. Specifically, the methods and techniques of the invention enable ribbon beams in which total intensity of ions in the part of the ribbon beam which strikes the wafer varies from about 3 uA to about 3 mA, and the ion dose delivered to the wafer is in the range from about 1E11 to 1E14 ions/cm$^2$. The methods and techniques may be used in an implanter which is designed specifically for medium current operation, or alternatively they may be used in an implanter which is capable of both medium and high current operation (doses from 1E11 to 5E15 ions/cm$^2$, and ribbon beam intensity from 3 uA to 30 mA).

Although the present invention has been explained in relation to its preferred embodiment, it is to be understood that other modifications and variation can be made without departing from the spirit and scope of the invention as hereafter claimed.

What is claimed is:

1. A method of setting up a medium current ribbon beam for ion implantation, the medium current ribbon beam having intensity from 3 uA to 3 mA, the method comprising:
   providing an ion source fed with a process gas and a support gas; and
   adjusting the ion source with a desired ratio of the process gas and the support gas to control the source plasma density of a process ion beam of the ion source to match a source extraction voltage and a source extraction gap.

2. The method of setting up a medium current ribbon beam for ion implantation according to claim 1, wherein the ion source has a source front plate with a slit or hole for extracting the process ion beam of the ion source and the source front plate is separated from a suppression electrode by a distance that defines the source extraction gap.

3. A method of setting up a medium current ribbon beam for ion implantation, the medium current ribbon beam having intensity from 3 uA to 3 mA, the method comprising:
   operating at least one current limiting device located downstream of an ion source to reduce ion beam current for ion implantation at a defined source plasma density of a process ion beam of the ion source.

4. The method of setting up a medium current ribbon beam for ion implantation according to claim 3, wherein the current limiting device operates by mechanically limiting passage of the process ion beam by means of a variable slit or aperture.

5. The method of setting up a medium current ribbon beam for ion implantation according to claim 3, further comprising:
   setting a mass analyzer to select the mass of process ions in the process ion beam.

6. The method of setting up a medium current ribbon beam for ion implantation according to claim 5, further comprising:
   setting at least one uniformity control device located in the beam line between the mass analyzer and a target, wherein the uniformity control device is operated to attain uniform ribbon beam at the target.

7. A method of setting up a medium current ribbon beam for ion implantation, the medium current ribbon beam having intensity from 3 uA to 3 mA, the method comprising:
   providing an ion source fed with a process gas and a support gas;
   adjusting the ion source with a desired ratio of the process gas and the support gas to control the source plasma density of a process ion beam of the ion source to match a source extraction voltage and a source extraction gap; and
   operating at least one current limiting device located downstream of the ion source to reduce ion beam current for ion implantation at the defined source plasma density of the process ion beam of the ion source.

8. The method of setting up a medium current ribbon beam for ion implantation according to claim 7, wherein the ion source has a source front plate with a slit or hole for extracting the process ion beam of the ion source and the source front plate is separated from a suppression electrode b a distance that defines the source extraction gap.

9. The method of setting up a medium current ribbon beam for ion implantation according to claim 7, further comprising: setting a mass analyzer to select the mass of process ions in the process ion beam.

10. The method of setting up a medium current ribbon beam for ion implantation according to claim 9, further comprising: setting at least one uniformity control device located in the beam line between the mass analyzer and a target, wherein the uniformity control device is operated to attain uniform ribbon beam at the target.

11. An ion beam system, comprising:
- an ion source fed with a process gas and a support gas, wherein a desired ratio of the process gas and the support gas is adjusted to control the source plasma density of a process ion beam of the ion source to match a source extraction voltage and a source extraction gap;
- a mass analyzer, to select the mass of process ions in the process ion beam;
- at least one current limiting device, located downstream of the ion source to reduce the beam current in the process ion beam; and
- at least one uniformity control device, located in the beam line between the mass analyzer and a target, wherein the uniformity control device is operated to attain uniform ribbon beam at the target.

12. The ion beam system according to claim 11, further comprising an acceleration/deceleration stage located between the mass analyzing magnet and the target.

13. The ion beam system according to claim 12, wherein there are two the uniformity control devices, one of the uniformity control device is before the acceleration/deceleration stage and another uniformity control device is after the acceleration/deceleration stage.

14. The ion beam system according to claim 11, wherein the ion source has a source front plate with a slit or hole for extracting the process ion beam of the ion source and the source front plate is separated from a suppression electrode by a distance that defines the source extraction gap.

* * * * *